us009437841B2

United States Patent
Zhou et al.

(10) Patent No.: US 9,437,841 B2
(45) Date of Patent: Sep. 6, 2016

(54) OLED DISPLAY STRUCTURE AND OLED DISPLAY DEVICE

(71) Applicant: BOE TECHNOLOGY GROUP CO., LTD., Beijing (CN)

(72) Inventors: Xiaodong Zhou, Beijing (CN); Jaegeon You, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 410 days.

(21) Appl. No.: 13/996,087

(22) PCT Filed: Jan. 25, 2013

(86) PCT No.: PCT/CN2013/070997
§ 371 (c)(1),
(2) Date: Jun. 20, 2013

(87) PCT Pub. No.: WO2013/166868
PCT Pub. Date: Nov. 14, 2013

(65) Prior Publication Data
US 2014/0203248 A1 Jul. 24, 2014

(30) Foreign Application Priority Data

May 10, 2012 (CN) .................. 2012 2 0210411 U (51) Int. Cl.
*G02B 27/28* (2006.01)
*H01L 51/52* (2006.01)
(Continued)

(52) U.S. Cl.
CPC ......... *H01L 51/5293* (2013.01); *G02B 5/3083* (2013.01); *G02B 27/283* (2013.01);
(Continued)

(58) Field of Classification Search
CPC ............... H01L 51/5293; H01L 51/50; H01L 27/3244; H01L 51/5271; H01L 51/5275; H01L 51/5281; G02B 27/283

USPC ........... 359/489.07, 489.08, 489.11, 489.12, 359/489.17; 313/112, 498
See application file for complete search history.

(56) References Cited

U.S. PATENT DOCUMENTS 5,626,408 A * 5/1997 Heynderickx et al. ......... 353/20
5,828,488 A * 10/1998 Ouderkirk et al. ...... 359/485.02
(Continued)

FOREIGN PATENT DOCUMENTS

CN 1368656 A 9/2002
CN 1774654 A 5/2006
(Continued)

OTHER PUBLICATIONS

International Search Report dated Apr. 25, 2013; PCT/CN2013/070997.
(Continued)

*Primary Examiner* — Frank Font
(74) *Attorney, Agent, or Firm* — Ladas & Parry LLP (57) ABSTRACT

Disclosed are an OLED display structure and an OLED display device having the OLED display structure. The OLED display structure comprises: a substrate (10), and an OLED pixel layer (20), an o-light and e-light splitting and converting device (5) and a circular polarizer layer (6) which are formed on the substrate (10) in sequence; the o-light and e-light splitting and converting device (5) is adapted to divide a light beam into o-light and e-light, and to convert the o-light and the e-light into circularly polarized light which has the same polarization state as the circular polarizer layer (6); the circular polarizer layer (6) is adapted to allow passage of the circularly polarized light which has the same polarization state as it. With the display structure, the light transmittance is improved, and the pixel current of the OLED pixel layer (20) is reduced, and thereby energy is saved.

16 Claims, 4 Drawing Sheets (51) Int. Cl.
*H01L 27/32* (2006.01)
*H01L 51/50* (2006.01)
*G02B 5/30* (2006.01)

(52) U.S. Cl.
CPC ........... *H01L27/3244* (2013.01); *H01L 51/50* (2013.01); *H01L 51/5271* (2013.01); *H01L 51/5275* (2013.01); *H01L 51/5281* (2013.01)

(56) References Cited

U.S. PATENT DOCUMENTS

| | | | |
|---|---|---|---|
| 6,101,032 A * | 8/2000 | Wortman et al. | 359/485.04 |
| 6,593,985 B1 * | 7/2003 | Taira et al. | 349/119 |
| 6,785,049 B1 * | 8/2004 | Boyd et al. | 359/485.03 |
| 2004/0095532 A1 * | 5/2004 | Parri et al. | 349/117 |
| 2005/0035353 A1 * | 2/2005 | Adachi | H01L 27/12 257/72 |
| 2005/0174641 A1 * | 8/2005 | Greenberg et al. | 359/486 |
| 2005/0194891 A1 | 9/2005 | Wu et al. | |
| 2006/0187548 A1 * | 8/2006 | Rao | C08J 7/047 359/487.02 |
| 2006/0262398 A1 * | 11/2006 | Sangu et al. | 359/486 |
| 2008/0048558 A1 * | 2/2008 | Song | H01L 51/5281 313/504 |
| 2008/0278812 A1 * | 11/2008 | Amitai | 359/487 |
| 2009/0052047 A1 * | 2/2009 | Amitai | 359/633 |
| 2011/0164221 A1 * | 7/2011 | Tilleman et al. | 353/20 |
| 2013/0094085 A1 * | 4/2013 | Merrill | 359/489.07 |
| 2013/0170034 A1 * | 7/2013 | Merrill et al. | 359/486.01 |
| 2015/0002010 A1 * | 1/2015 | Lee et al. | 313/112 |

FOREIGN PATENT DOCUMENTS

| | | |
|---|---|---|
| CN | 202008552 U | 10/2011 |
| CN | 202549937 U | 11/2012 |
| EP | 1223618 A2 | 7/2002 |
| KR | 20020061474 A | 7/2002 |

OTHER PUBLICATIONS

Korean Intellectual Property Office Examination Opinion dated Apr. 10, 2014; Appln. No. 10-2013-7015272.
Korean Examination Opinion dated Oct. 29, 2014: Appln. No. 1020137015272.
International Preliminary Report on Patentability dated Nov. 11, 2014; PCT/CN2013/070997.
Extended European Search Report dated Feb. 25, 2016; Appln. No. 13724495.0-1562 /2849242; PCT/CN2013070997.

* cited by examiner

OLED DISPLAY STRUCTURE AND OLED DISPLAY DEVICE

TECHNICAL FIELD

Embodiments of the present invention relate to an organic light emitting diode (OLED) display structure and an OLED display device having the OLED display structure.

BACKGROUND

Organic Light-Emitting Diode (OLED) display devices are widely used in MP3 players and the like digital products due to their characteristics of light weight, thin profile, energy-saving, etc. The OLED display technology differs from the conventional LCD (Liquid Crystal Display) display technology, it does not need a backlight module and typically adopts very thin organic material films and a glass substrate, and these organic materials will emit light when a current passes through them. Moreover, an OLED display screen can be made-lighter, thinner, and capable of saving electric energy remarkably, and have wider viewing angles. However, as a display device, the OLED display screen is also affected by an external use environment. Especially in an outdoor, strong-light environment, display effect of the OLED display screen will be degraded to some extent.

Figure 1:
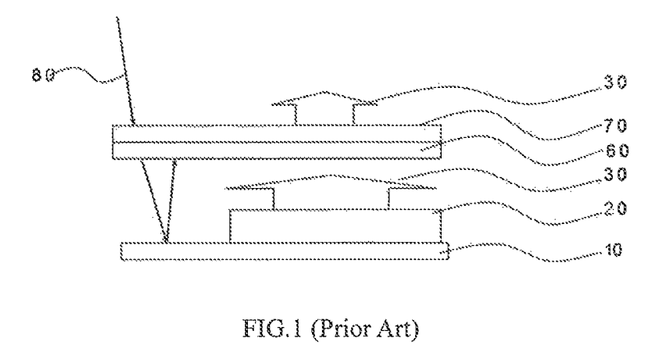
FIG. 1 is a structurally schematic view showing an existing OLED display structure.

In order to overcome the influence of ambient light, as shown in FIG. 1, an OLED display structure has been proposed, and it eliminates the influence of strong ambient light on the display by providing a quarter-wave plate layer 60 and a linearly polarizer layer 70 on an OLED pixel layer 20 in sequence. Its operational principle will be described below. Ambient light 80 is incident into a display screen, and is changed to linearly polarized light after it passes through the linearly polarizer layer 70 firstly, and then the linearly polarized light passes through the quarter-wave plate layer 60 (an optical axis of which is at an angle of ±45° with respect to the polarization direction of the linearly polarized light) to change to right-handed or left-handed circularly polarized light. That is, the linearly polarizer layer 70 and the quarter-wave plate layer 60 work in combination as a right-handed or left-handed circular polarizer, which can convert natural light into right-handed or left-handed circularly polarized light. The right-handed or left-handed circularly polarized light is changed into left-handed or right-handed circularly polarized light, for example, after it is reflected by a substrate 10, and is further changed to linearly polarized light again after it passes through the above quarter-wave plate layer 60 for the second time, but its polarization direction is rotated by 90° to exactly coincide with the absorption axis of the linearly polarizer layer 70. Thereby, the reflected light is absorbed by the linearly polarizer layer 70 and cannot be transmitted therethrough. That is, right-handed circularly polarized light cannot pass through a left-handed circular polarizer, or left-handed circularly polarized light cannot pass through a right-handed circular polarizer. Therefore, with the above configuration, such objects that the influence of ambient light is eliminated, contrast is enhanced, and visual effect is improved can be achieved.

However, light emitted by the OLED pixel layer 20 have no polarization characteristics, and still does not possess polarization characteristics yet after it is transmitted through the quarter-wave plate layer 60, while their energy is absorbed in half upon passing through the linearly polarizer layer 70. Further due to influence factors like scattering, reflection and so on, the transmittance of light is greatly reduced. This results in the consequence that, in order to obtain suitable brightness, pixel currents have to be increased in practice. In turn, this brings about waste of energy.

SUMMARY

Regarding the above shortcomings, embodiments of the invention provide an OLED display structure and an OLED display device comprising the above OLED display structure, which can overcome impact of ambient light, but will not absorb or scatter too much light emitted by itself, so that light transmittance is increased and then energy is saved.

In an aspect of the invention, there is provided an OLED display structure, comprising: a substrate, and an OLED pixel layer, an o-light and e-light splitting and converting device and a circular polarizer layer which are formed on the substrate in sequence, wherein the o-light and e-light splitting and converting device is adapted to divide a light beam into o-light and e-light, and to convert the o-light and the e-light into circularly polarized light which has the same polarization state as the circular polarizer layer; and the circular polarizer layer is adapted to allow passage of the circularly polarized light which has the same polarization state as it.

As for the display structure, for example, the o-light and e-light splitting and converting device comprises a birefringent crystal layer, and an o-light quarter-wave plate layer and an e-light quarter-wave plate layer which are formed on the birefringent crystal layer; the o-light quarter-wave plate layer is adapted for converting the o-light into circularly polarized light which has the same polarization state as the circular polarizer layer; and the e-light quarter-wave plate layer is adapted for converting the e-light into circularly polarized light which has the same polarization state as the circular polarizer layer.

As for the display structure, for example, directions of optical axes of the o-light quarter-wave plate layer and the e-light quarter-wave plate layer are perpendicular to each other, and the optical axes of the o-light quarter-wave plate layer and the e-light quarter-wave plate layer form an angle of 45° with respect to polarization directions of the corresponding o-light and e-light, respectively.

As for the display structure, for example, the birefringent crystal layer is made from a material possessing a birefringent property such as calcite crystal, quartz, ruby, or the like.

As for the display structure, for example, the circular polarizer layer comprises a quarter-wave plate layer and a linear polarizer formed thereon; the quarter-wave plate layer is adapted to convert circularly polarized light into linearly polarized light, and the linear polarizer is adapted to allow passage of linearly polarized light which has the same polarization direction as its.

For example, the OLE) display structure may further comprise a lens layer, which is located between the OLED pixel layer and the o-light and e-light splitting and converting device, and adapted to converge light beams which are emitted from the OLED pixel layer to be parallel light beams to enter the o-light and e-light splitting and converting device.

As for the display structure, for example, the lens layer comprises a transparent substrate, and a first convex lens and a second convex lens which are formed on two opposite sides of the transparent substrate, respectively; focal points or focal planes of the first convex lens and the second convex lens coincide with each other.

As for the display structure, for example, the lens layer comprises a transparent substrate, and a first convex lens and a concave lens microstructure layer which are formed on two opposite sides of the transparent substrate, respectively, wherein the first convex lens and the concave lens microstructure layer cooperate to converge light beams into parallel light beams.

As for the display structure, for example, the transparent substrate may further comprise a reflective layer, by which ambient light is reflected to the circular polarizer layer for absorption.

In another aspect of the invention, there is further provided an OLED display device, comprising an OLED display structure stated as any of the above items.

The OLED display structure and the OLED display device having the OLED display structure according to embodiments of the invention, by dividing a light emitted from the OLED pixel layer into o-light and e-light, and converting the o-light and the e-light into circularly polarized light which has the same polarization state as the circular polarizer layer to pass through the circular polarizer layer totally, improve light transmittance, reduce pixel current of the OLED pixel layer, thereby saving energy.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE SIGNS

4: a lens layer; 5: an o-light and e-light splitting and converting device; 6: a circular polarizer layer; 10: a substrate; 20: an OLED pixel layer; 30: light beam(s); 40: a transparent substrate; 41: a first convex lens; 42: a second convex lens; 43: a concave lens microstructure layer; 50: a birefringent crystal layer; 51: an o-light quarter-wave plate layer; 52: an e-light quarter-wave plate layer; 60: a quarter-wave plate layer; 70: a polarizer, 80: ambient lights; 90: a reflective layer.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term "a," "an," "the" or the like does not indicate limitation in number, but specifies the presence of at least one. A term such as "comprises," "comprising," "comprises," "comprising", "contains" or the like means that an element or article ahead of this term encompasses element(s) or article(s) listed behind this term and its (their) equivalents, but does not preclude the presence of other elements or articles. A term such as "connection," "connected," or the like is not limited to physical or mechanical connection, but can comprise electrical connection, whether directly or indirectly. "Upper," "lower," "left," "right" or the like is only used to describe a relative positional relationship, and when an absolute position of the described object is changed, the relative positional relationship might also be changed accordingly.

According to the principle of birefringence of light, when a light beam is incident into a birefringent crystal, it turns into two beams of linearly polarized light after refraction, one beam of which follows the law of refraction and is called as ordinary light ("o-light"), and another beam of which does not follow the law of refraction and is called as extraordinary light ("e-light"). A birefringent crystal refers to a crystal which allows light to generate birefringence, such as a calcite crystal, quartz, ruby, or the like material possessing a birefringent property.

Figure 2:
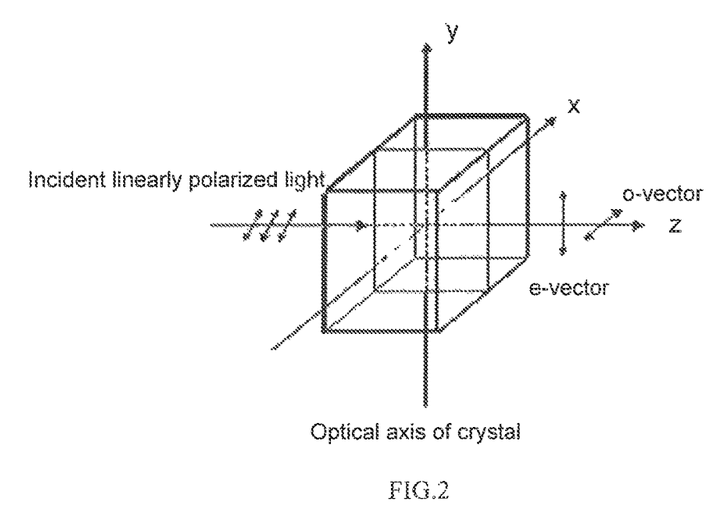
FIG. 2 is a schematic view showing a phenomenon of birefringence of a birefringent crystal in a space rectangular coordinate system in the relevant art.

As shown in FIG. 2, if the light traveling direction of an incident, linearly polarized light beam is the positive direction of the z-axis in the space rectangular coordinate system, and it is perpendicular to the positive direction of an x-axis in the space rectangular coordinate system that is directed toward the inside of the paper plane, and perpendicular to the positive direction of the y-axis in the space rectangular coordinate system that is directed upward from the plane in which the x and z axes are located, then the vibration plane of the o-light is the x-o-z plane, and the vibration plane of the e-light is the y-o-z plane.

An OLED display structure according to an embodiment of the invention comprises: a substrate 10, and an OLED pixel layer 20, an o-light and e-light splitting and converting device and a circular polarizer layer which are formed on the substrate 10 in sequence; the o-light and e-light splitting and converting device is adapted to divide a light beam 30 emitted from the OLED pixel layer into o-light and e-light and to convert o-light and e-light into circularly polarized light which has the same polarization state as the circular polarizer layer; and the circular polarizer layer is adapted to allow passage of circularly polarized light which has the same polarization state as its.

With respect to the above OLED display structure, light emitted from an OLED pixel layer is divided into o-light and e-light, and o-light and e-light are converted into circularly polarized light which have the same polarization state as the circular polarizer layer, so that it passes through the circular polarizer layer totally and then exit for display. This enhances the light transmittance and reduces the pixel current of the OLED pixel layer, thereby saving the energy.

In some embodiments of the invention, the OLED display structure may further comprise a lens layer, and the lens layer may be located between the OLED pixel layer and the o-light and e-light splitting and converting device, and adapted to converge light beams which are emitted from the OLED pixel layer to be parallel light beams to enter the o-light and e-light splitting and converting device. This helps the o-light and e-light splitting and converting device better conduct beam-splitting, avoids influence due to light components in other directions, and raises the light transmittance of the OLED display structure.

The o-light and e-light splitting and converting device stated in the OLED display structure according to an embodiment of the invention may comprise a birefringent crystal layer 50, and may comprise an o-light quarter-wave plate layer 51 and an e-light quarter-wave plate layer 52 which are formed on the birefringent crystal layer 50. The birefringent crystal layer 50 can be made from a material possessing a birefringent property such as a calcite crystal, quartz, ruby, or the like. The directions of the optical axes of the o-light quarter-wave plate layer 51 and the e-light quarter-wave plate layer 52 are perpendicular to each other, and the optical axes of the o-light quarter-wave plate layer 51 and the e-light quarter-wave plate layer 52 forms an angle of 45° with respect to the polarization directions of the corresponding o light and e-light, respectively. The o-light quarter-wave plate layer 51 is adapted to convert the o-light into circularly polarized light which has the same polarization state as the circular polarizer layer; and the e-light quarter-wave plate layer 52 is adapted to convert the e-light into circularly polarized light which has the same polarization state as the circular polarizer layer.

The circular polarizer layer stated in the OLED display structure according to the embodiment of the invention may comprise a quarter-wave plate layer 60 and a linear polarizer 70 formed thereon; left-handed or right-handed circularly polarized light can be converted into linearly polarized light due to the polarization state of the quarter-wave plate layer 60, and the linear polarizer 70 is adapted to allow passage of linearly polarized light which has the same polarization direction as the linear polarizer.

In an embodiment of the invention, the OLED pixel layer can be formed by any available process in the art; for example, it is a stacked structure which comprises a cathode layer, an organic light emitting layer, and an anode layer. The stacked structure may further comprise auxiliary function layers such as an electron transportation layer, a hole transportation layer, etc. After a voltage is applied, in the OLED pixel layer, holes injected from the anode and electrons injected from the cathode recombine in the light emitting layer so as to emit light. The scope of the invention is not limited to the specific structure of the OLED pixel layer.

Embodiment 1

Figure 3A:
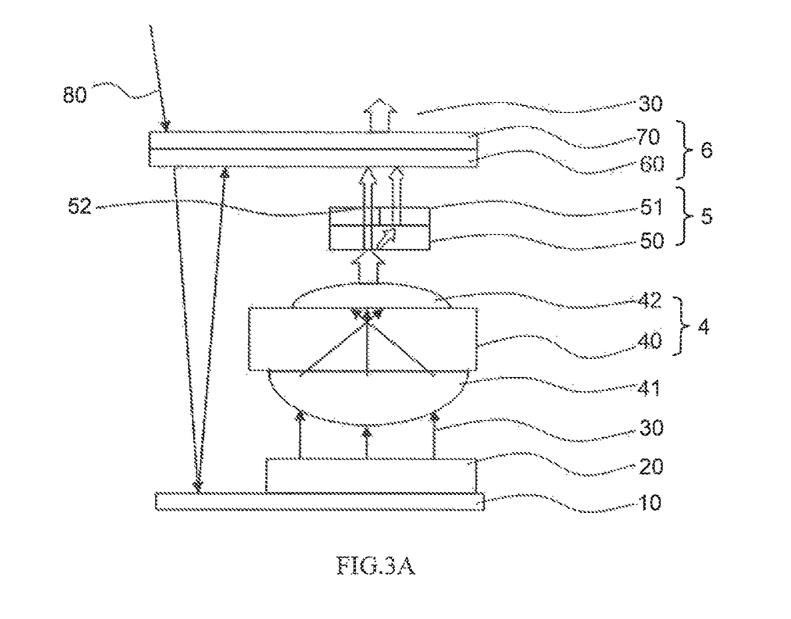
FIG. 3A is a structurally schematic view showing an OLED display structure according to an embodiment 1 of the invention.

As shown in FIG. 3A, an OLED display structure in the embodiment comprises: a substrate 10 and an OLED pixel layer 20, a lens layer 4, an o-light and e-light splitting and converting device 5 and a circular polarizer layer 6 which are formed on the substrate 10 from bottom to top in sequence. The light emitted upward from the OLED pixel layer 20 passes through the lens layer 4, the o-light and e-light splitting and converting device 5 and the circular polarizer layer 6 in sequence, and then exits for display.

The o-light and e-light splitting and converting device 5 is adapted to divide a light beam 30, which is emitted from the OLED pixel layer 20 and transmitted through this o-light and e-light splitting and converting device 5, into o-light and e-light, and to convert the o-light and the e-light into circularly polarized light which have the same polarization state as the circular polarizer layer; and the circular polarizer layer 6 is adapted to allow passage of the circularly polarized light which has the same polarization state as its.

Figure 3B:
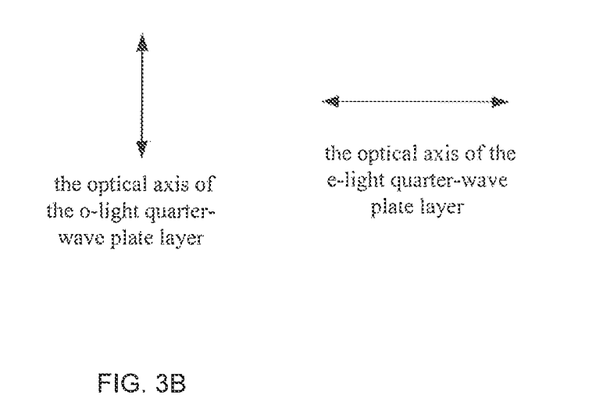
FIG. 3B is a schematic view showing directions of optical axes of the o-light quarter-wave plate layer and the e-light quarter-wave plate layer are perpendicular to each other according to an embodiment 1 of the invention.
Figure 3C:
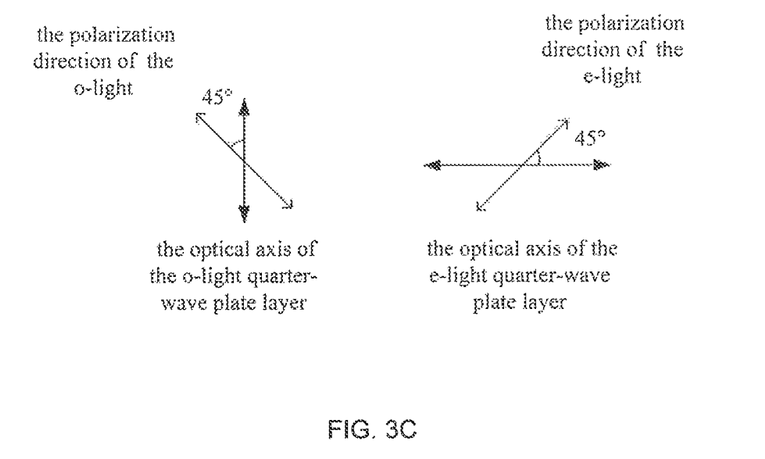
FIG. 3C is a schematic view showing the optical axes of the o-light quarter-wave plate layer and the e-light quarter-wave plate layer form an angle of 45° with respect to polarization directions of the corresponding o-light and e-light, respectively, according to an embodiment 1 of the invention.

The o-light and e-light splitting and converting device 5 comprises a birefringent crystal layer 50, and an o-light quarter-wave plate layer 51 and an e-light quarter-wave plate layer 52 which are formed thereon. The birefringent crystal layer 50 may be formed of a material possessing a birefringent property such as a calcite crystal, quartz, ruby, or the like. The directions of the optical axes of the o-light quarter-wave plate layer 51 and the e-light quarter-wave plate layer 52 are perpendicular to each other, as shown in FIG. 3B, and the optical axes of the o-light quarter-wave plate layer 51 and the e-light quarter-wave plate layer 52 form an angle of 45° with the polarization directions of the corresponding o-light and e-light, respectively, as shown in FIG. 3C. The o-light quarter-wave plate layer 51 is adapted to convert the o-light into circularly polarized light which has the same polarization state as the circular polarizer layer; and the e-light quarter-wave plate layer 52 is adapted to convert the e-light into circularly polarized light which has the same polarization state as the circular polarizer layer. The o-light quarter-wave plate layer 51 and the e-light quarter-wave plate layer 52 are provided on the birefringent crystal layer 50 side by side, for example, each occupies a half of the top surface of the birefringent crystal layer 50.

The circular polarizer layer 6 comprises a quarter-wave plate layer 60 and a linear polarizer 70 formed thereon. Left-handed or right-handed circularly polarized light can be converted into linearly polarized light due to the polarization state of the quarter-wave plate layer 60, and the linear polarizer 70 is adapted to allow passage of linearly polarized light which has the same polarization direction as its.

The lens layer 4 comprises a transparent substrate 40, and comprises a first convex lens 41 and a second convex lens 42 which are formed on two opposite sides of the transparent substrate 40, respectively, and focal points or focal planes of the first convex lens 41 and the second convex lens 42 coincide with each other. The lens layer 4 is adapted to converge the light beam 30 so as to improve the display effect.

In the embodiment, for example, the substrate 10 may have a reflective property, or a reflective layer is formed on the substrate 10 for reflecting incident ambient light 80 from outside of the display device upward or for reflecting light emitted from the OLED pixel layer upward. The ambient light 80 is subjected to light extinction due to existence of the circular polarizer layer 6, and this reduces impact of the ambient light 80 greatly.

Embodiment 2

Figure 4:
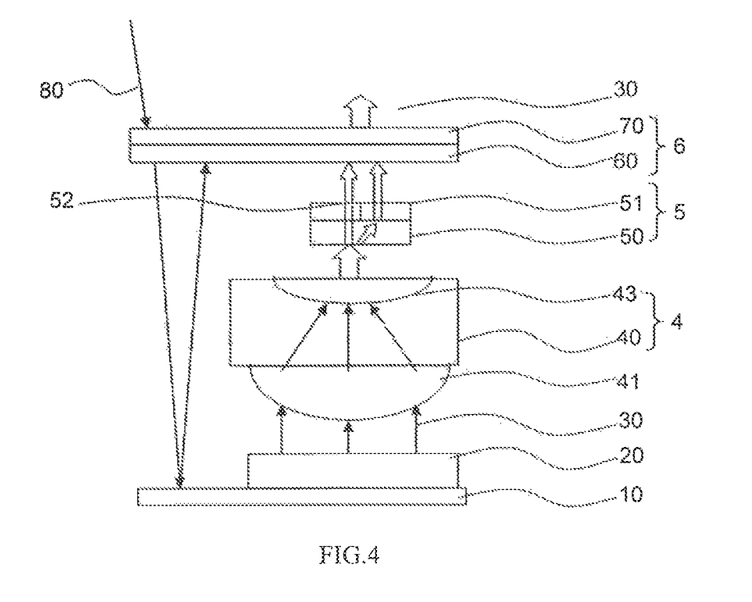
FIG. 4 is a structurally schematic view showing an OLED display structure according to an embodiment 2 of the invention.

As shown in FIG. 4, the embodiment is substantially the same as Embodiment 1, and the only difference is that, a lens layer 4 comprised in an OLED display structure according to the embodiment comprises a transparent substrate 40, and a first convex lens 41 and a concave lens microstructure layer 43 which are formed on two opposite sides of the transparent substrate 40, respectively; the first convex lens 41 and the concave lens microstructure layer 43 cooperate to converge light to be parallel light beams.

Embodiment 3

Figure 5:
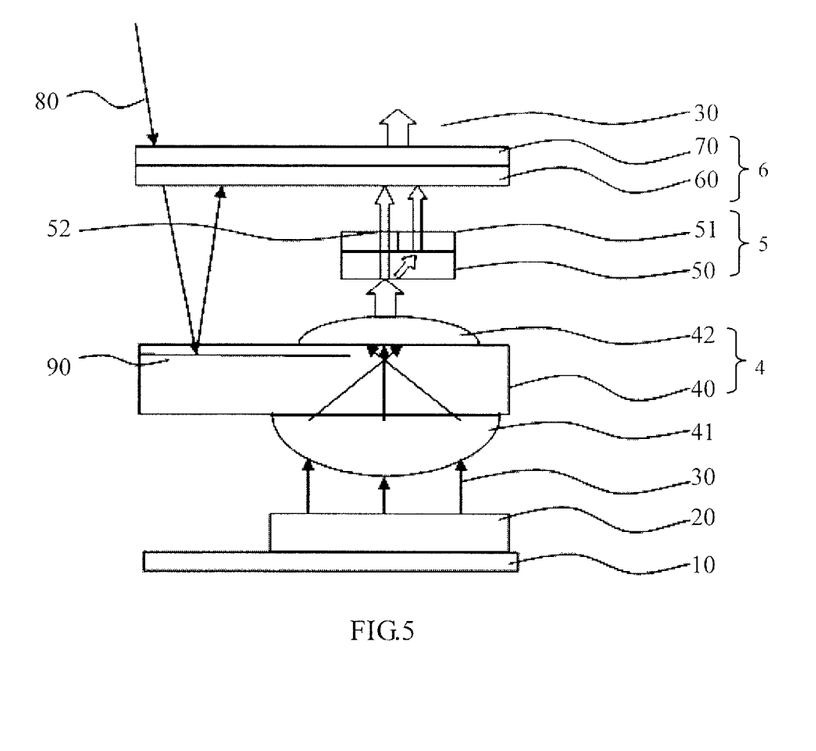
FIG. 5 is a structurally schematic view showing an OLED display structure according to an embodiment 3 of the invention.

As shown in FIG. 5, the embodiment is substantially the same as Embodiment 1, and the only difference is that, the lens layer 4 further comprises a reflective layer 90 which is provided on the transparent substrate 40 and used to reflect ambient light 80 totally to the circular polarizer layer for absorption, which reduces impact of the ambient light 80 greatly.

The above embodiments can be combined with each other or replaced by each other so as to form a new embodiment. For example, the lens layer in Embodiment 2 may be used to replace the lens layer (except the reflective layer 90) in Embodiment 3, to thereby obtain a new embodiment.

In addition, according to another embodiment of the invention, there is further comprised an OLED display device which comprises the above OLED display structure.

Thus, an OLED display structure and an OLED display device comprising the OLED display device are disclosed by an embodiment of the invention. With the above OLED display structure, light emitted from the OLED pixel layer is divided into o-light and e-light, and both the o-light and the e-light are converted into circularly polarized light which has the same polarization state as the circular polarizer layer so as to pass through the circular polarizer layer totally and exit. This improves the light transmittance, and reduces the pixel current of the OLED pixel layer, thereby saving energy. According to an embodiment of the invention, a reflective layer may be further provided so as to reduce impact of ambient light further. Thus, the readability in an outdoor environment is improved, and adaptability to environments becomes strong. Further, the birefringent crystal material has many kinds and an excellent performance and belongs to a mature technology, so that the production costs can be reduced.

The foregoing are merely exemplary embodiments of the invention, but are not used to limit the protection scope of the invention. The protection scope of the invention is determined by attached claims.

The invention claimed is:

1. An Organic Light Emitting Diode (OLED) display structure, comprising: a first substrate and an OLED pixel layer, an o-light and e-light splitting and converting device, and a circular polarizer layer which are provided in sequence on the first substrate, wherein
the o-light and e-light splitting and converting device is adapted to divide a light beam emitted from the OLED pixel layer into o-light and e-light, and to convert the o-light and the e-light into circularly polarized light which has the same polarization state as the circular polarizer layer; and
the circular polarizer layer is adapted to allow passage of the circularly polarized light which has the same polarization state as the circular polarizer layer.

2. The OLED display structure claimed in claim 1, wherein the o-light and e-light splitting and converting device comprises a birefringent crystal layer, and an o-light quarter-wave plate layer and an e-light quarter-wave plate layer which are formed on the birefringent crystal layer, wherein,
the o-light quarter-wave plate layer is adapted to convert the o-light into circularly polarized light which has the same polarization state as the circular polarizer layer, and
the e-light quarter-wave plate layer is adapted to convert the e-light into circularly polarized light which has the same polarization state as the circular polarizer layer.

3. The OLED display structure claimed in claim 2, wherein directions of optical axes of the o-light quarter-wave plate layer and the e-light quarter-wave plate layer are perpendicular to each other, and the optical axes of the o-light quarter-wave plate layer and the e-light quarter-wave plate layer form an angle of 45° with respect to polarization directions of the corresponding o-light and e-light, respectively.

4. The OLED display structure claimed in claim 2, wherein the birefringent crystal layer is made from calcite crystal, quartz or ruby.

5. The OLED display structure claimed in claim 1, wherein the circular polarizer layer comprises a quarter-wave plate layer and a linear polarizer formed on the quarter-wave plate layer, wherein
the quarter-wave plate layer is adapted to convert circularly polarized light into linearly polarized light; and
the linear polarizer is adapted to allow passage of linearly polarized light which has the same polarization direction as the linear polarizer.

6. The OLED display structure claimed in claim 1, further comprising a lens layer, which is located between the OLED pixel layer and the o-light and e-light splitting and converting device, and adapted to converge light beams which are emitted from the OLED pixel layer to be parallel light beams to enter the o-light and e-light splitting and converting device.

7. The OLED display structure claimed in claim 6, wherein the lens layer comprises a second transparent substrate, and a first convex lens and a second convex lens which are formed on two opposite sides of the second transparent substrate, respectively, wherein
focal points or focal planes of the first convex lens and the second convex lens coincide with each other.

8. The OLED display structure claimed in claim 6, wherein the lens layer comprises a second transparent substrate, and a first convex lens and a concave lens microstructure layer which are formed on two opposite sides of the second transparent substrate, respectively, wherein
the first convex lens and the concave lens microstructure layer cooperate to converge light beams into parallel light beams.

9. The OLED display structure claimed in claim 7, wherein the second transparent substrate further comprises a reflective layer, by which ambient light incident from outside of the display structure is reflected to the circular polarizer layer for absorption.

10. An Organic Light Emitting Diode (OLED) display device, comprising the OLED display structure claimed in claim 1.

11. The OLED display structure claimed in claim 3, wherein the birefringent crystal layer is made from calcite crystal, quartz or ruby.

12. The OLED display structure claimed in claim 2, wherein the circular polarizer layer comprises a quarter-wave plate layer and a linear polarizer formed on the quarter-wave plate layer, wherein the quarter-wave plate layer is adapted to convert circularly polarized light into linearly polarized light; and the linear polarizer is adapted to allow passage of linearly polarized light which has the same polarization direction as the linear polarizer.

13. The OLED display structure claimed in claim 3, wherein the circular polarizer layer comprises a quarter-wave plate layer and a linear polarizer formed on the quarter-wave plate layer, wherein the quarter-wave plate layer is adapted to convert circularly polarized light into linearly polarized light; and the linear polarizer is adapted to allow passage of linearly polarized light which has the same polarization direction as the linear polarizer.

14. The OLED display structure claimed in claim 2, further comprising a lens layer, which is located between the OLED pixel layer and the o-light and e-light splitting and converting device, and adapted to converge light beams which are emitted from the OLED pixel layer to be parallel light beams to enter the o-light and e-light splitting and converting device.

15. The OLED display structure claimed in claim 3, further comprising a lens layer, which is located between the OLED pixel layer and the o-light and e-light splitting and converting device, and adapted to converge light beams which are emitted from the OLED pixel layer to be parallel light beams to enter the o-light and e-light splitting and converting device.

16. The OLED display structure claimed in claim 8, wherein the second transparent substrate further comprises a reflective layer, by which ambient light is reflected to the circular polarizer layer for absorption.

* * * * *